United States Patent [19]

Shangguan et al.

[11] Patent Number: 5,996,222
[45] Date of Patent: Dec. 7, 1999

[54] SOLDERING PROCESS WITH MINIMAL THERMAL IMPACT ON SUBSTRATE

[75] Inventors: Dongkai Shangguan, Novi; Myron Lemecha, Dearborn; Achyuta Achari, Canton, all of Mich.

[73] Assignee: Ford Motor Company, Dearborn, Mich.

[21] Appl. No.: 09/084,867

[22] Filed: May 26, 1998

Related U.S. Application Data

[62] Division of application No. 08/786,388, Jan. 16, 1997.

[51] Int. Cl.$^6$ ..................................................... H05K 3/34
[52] U.S. Cl. ........................................................... 29/840
[58] Field of Search .............................. 29/840, 825, 830, 29/832

[56] References Cited

U.S. PATENT DOCUMENTS

| | | |
|---|---|---|
| 3,380,155 | 4/1968 | Burks . |
| 3,501,832 | 3/1970 | Iwata et al. . |
| 3,680,196 | 8/1972 | Leinkram . |
| 4,254,448 | 3/1981 | Martyniak . |
| 4,361,862 | 11/1982 | Martyniak . |
| 4,635,354 | 1/1987 | Chrobak et al. . |
| 4,774,126 | 9/1988 | Dorsey et al. . |
| 4,821,946 | 4/1989 | Abe et al. . |
| 5,075,965 | 12/1991 | Carey et al. ............................... 29/840 |
| 5,172,852 | 12/1992 | Bernardoni et al. . |
| 5,186,378 | 2/1993 | Alfaro . |
| 5,259,546 | 11/1993 | Volk . |
| 5,477,419 | 12/1995 | Goodman et al. ..................... 29/840 X |
| 5,495,089 | 2/1996 | Freedman et al. ..................... 29/840 X |
| 5,515,605 | 5/1996 | Hartmann et al. . |
| 5,574,629 | 11/1996 | Sullivan . |
| 5,829,125 | 11/1998 | Fujimoto et al. . |

FOREIGN PATENT DOCUMENTS 55-109566  8/1980  Japan .

*Primary Examiner*—Carl J. Arbes
*Attorney, Agent, or Firm*—Leslie C. Hodges; Roger L. May

[57] ABSTRACT

A soldering process is suitable for use with low cost, low heat distortion temperature thermoplastic substrates without distortion or damage to the substrate yet having the mass production capability exhibited by wave and reflow soldering techniques. The process allows integration of consumer products and, in particular, vehicle components such as integrated instrument panel or other such assemblies, without the redundancy of separate printed circuit boards.

12 Claims, 2 Drawing Sheets

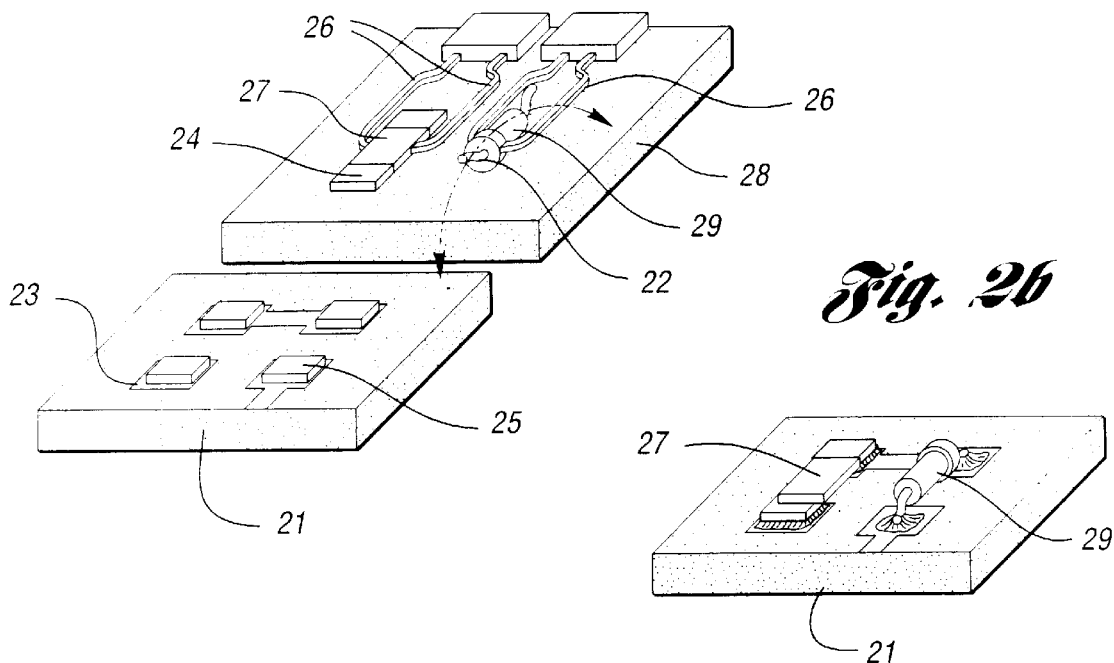
Fig. 2a
Fig. 2b
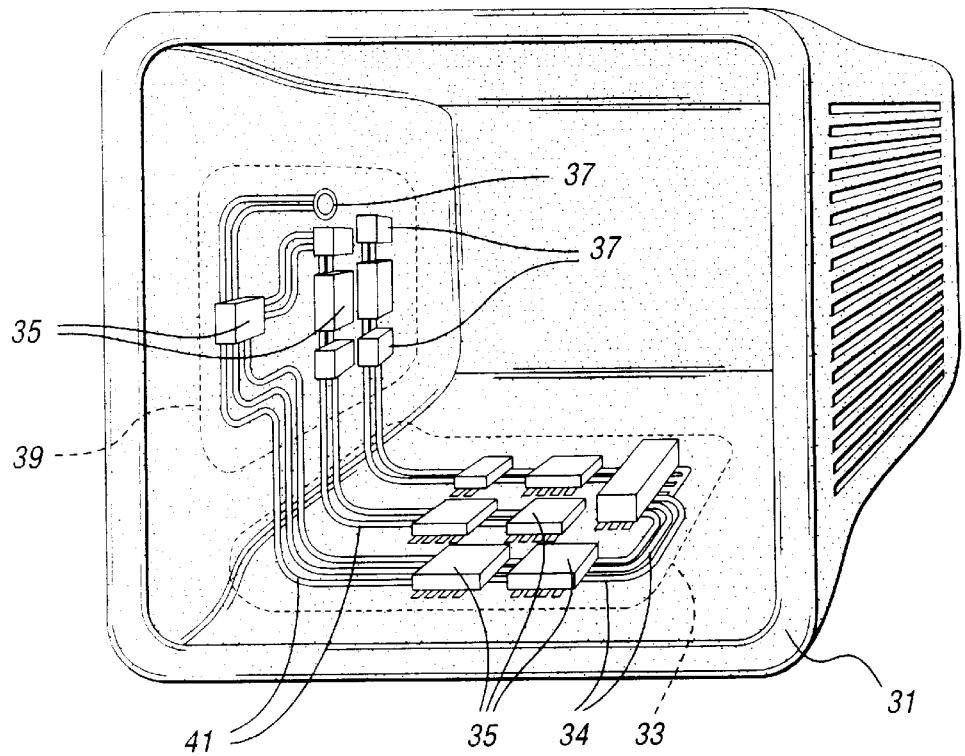
Fig. 3

SOLDERING PROCESS WITH MINIMAL THERMAL IMPACT ON SUBSTRATE

This is a divisional of copending application Ser. No. 08/786,388, filed on Jan. 16, 1997.

TECHNOLOGICAL FIELD

The present invention pertains to a soldering process suitable for use with inexpensive polymer substrates having low heat distortion temperatures without distortion or other thermally induced damage.

DESCRIPTION OF THE RELATED ART

At one time, virtually all electronic devices, ranging from computers to radios, televisions, radar and other consumer, industry, and military electronics, were assembled from discrete components on a metal chassis. Electrical connections were made by hand soldering using a soldering iron or soldering gun. With the advent of the transistor and attendant miniaturization, the metal chassis as a means to support individual components gave way to use of printed circuit boards. The latter were generally fiberglass or paper impregnated with phenolic or epoxy resins, with a relatively thick copper layer plated onto or laminated to one or both sides, the copper layer(s) etched to form the necessary conductive paths and device mounting pads. In most cases, the printed circuit boards were mounted in metal frames, or attached to other support structures using insulative spacers and traditional fasteners. As familiarity with printed circuit boards grew, and as product volumes increased, new soldering methods began to replace hand soldering.

In reflow soldering, solder (such as solder paste) is applied (e.g. printed) onto the circuit board and at a later stage following placement of electronic components on the board, heat is applied to melt or "reflow" the solder. Heat may be applied locally, but for volume production, ovens, through which conveyors carrying component-loaded boards pass, are used.

A further mass production technique is wave soldering. In wave soldering, a tank of molten solder is maintained, and a pump drives solder over a dam forming a wave of uniform height across the width of the tank. Printed circuit boards, with the electronic components mounted on top and the leads emanating from the lower surface of the board, and/or with surface mount devices (SMD) attached (for example, with adhesives) on the bottom surface of the board, are conveyed across the top of the tank such that the crest of the wave contacts the lower surface of the board, electrically and mechanically joining the electronic devices to the circuit by soldering the component leads or end termination to the exposed copper conductors (i.e. the pad area). Areas of the board which are not desired to obtain solder are coated with a temperature resistant solder mask.

While reflow soldering and wave soldering offer a tremendous increase in throughput and quality relative to hand soldering, and are well suited to use both with epoxy or phenolic laminate circuit boards as well as circuit boards or flexible films of high temperature thermoplastics such as polysulfones, polyarylene sulfides, polyimides, polyetherimides, and the like, such techniques are highly unsuitable for use with common, inexpensive thermoplastics having relatively low heat distortion temperatures (HDT) and melting points. Examples of such thermoplastics are polyvinylchloride, polypropylene, ABS, polyurethane, polystyrene, and other thermoplastics which constitute the majority of polymers used in consumer goods. These materials will be greatly distorted by heat, have their mechanical properties adversely altered, or sustain cosmetic surface damage due to the heat generated in reflow and wave soldering. Factually, the high distortion and low melting temperatures of these polymers has been taken advantage of to facilitate component interconnection in both reflow and wave soldering techniques.

For example, in U.S. Pat. No. 3,501,832, a polymer component having electrical connections plated thereon or embedded therein is forced under pressure on top of a device requiring electrical interconnections on varying planes, one or both of the polymer component or device component having a solder coating. Heating the device to melt the solder also heats the polymer beyond its heat distortion temperature, deforming the polymer, e.g. polyethylene, during the soldering process so as to allow connections at various heights. The deformed thermoplastic may remain to serve as a protective cover over the components. In U.S. Pat. No. 4,254,448, thermoplastic pins are inserted into a circuit board, electronic components mounted, and the thermoplastic pins heated and deformed to secure the various leads in the correct positions for reflow soldering. The now-redundant pins, if not already melted away, may be removed by melting or other means.

The inability to use mass production soldering techniques such as reflow soldering and wave soldering with low cost, low HDT thermoplastic substrates renders the use of the latter impractical, and raises the cost of electronic assemblies. This detriment was recognized in U.S. Pat. No. 4,774,126 which disclosed use of low HDT thermoplastics by forming a sandwich structure with a low HDT thermoplastic core flanked by high performance thermoplastic exterior surfaces of thickness suitable to absorb the heat generated by wave or reflow soldering. However, this technique still requires use of expensive thermoplastics as the sandwich exterior, and requires manufacture of unique sandwich structure devices. Thus, the cost improvement is marginal at best.

The inability to utilize low cost thermoplastics as electronic substrates affects more than the cost of printed circuit boards alone. For example, in the manufacture of devices such as computers and televisions, the cases are generally constructed of low cost thermoplastics, and in automobiles, easily moldable, low cost thermoplastics are used for such components as center consoles, dashboards, and the like. It is totally impractical, and in many cases, impossible, to employ high HDT thermoplastics such as polyamide or polyetherimide for these components.

Hence, if components such as those previously described are to include electronic elements requiring interconnection, it is necessary to utilize separate circuit boards and then mount these boards to the case or automotive component. Such methods are inherently redundant, increasing both component weight and cost, and in addition necessitate increased assembly time, further increasing costs. For example, in automotive dashboards, large printed circuit boards or several smaller boards with wiring harness or ribbon conductor interconnects may be required, together with necessary mounting pedestals, mounting hardware, and the like. Inability to directly attach and interconnect electronic components on low cost, low HDT thermoplastics has become a limiting factor in system integration, for example, vehicle instrument panel integration.

It would be desirable to provide a process for the interconnection of electronic components which maintains the mass production throughput of techniques such as reflow and wave soldering and yet which may be used with inexpensive thermoplastics having low HDT. It would be further desirable to provide a process where a load bearing and/or aesthetic component of low HDT thermoplastic may be used as a substrate for the mounting and interconnection of electronic devices without the redundancy of separate circuit boards and mounting devices. It would further be desirable to provide a high volume efficient production process suitable for use with low HDT substrates. It would further be desirable to implement a process whereby physical and functional integration of complex structures constructed of low HDT thermoplastics with other polymers/metals that make up the product is facilitated.

SUMMARY OF THE INVENTION

A method of soldering components onto low HDT thermoplastic substrates has been developed which allows for high throughput similar to that exhibited by reflow and wave soldering techniques; and which surprisingly allows even large complex structures of low HDT thermoplastics to be used directly as a substrate for electronic components without melting or distortion, thus eliminating one barrier to using low cost materials in consumer and transportation components. The method comprises providing a substrate of a low HDT thermoplastic having applied thereon a low temperature solder such as solder preform onto the circuit conductor pad; preheating the substrate to a temperature below the melting point of the solder and below the HDT of the substrate; preheating components to be soldered to a temperature above the melting point of the solder such that the thermal energy stored in the component is sufficient to cause the solder to melt and flow upon contacting of the component and the solder; and contacting the component and its respective solder on the pad for a time sufficient for the solder to melt, flow, and establish a metallurgically and electrically sound joint. The ability to avoid high temperatures allows low HDT substrates to be used.

BRIEF DESCRIPTION OF THE DRAWINGS

FIGS. 2a and 2b illustrate one embodiment of the subject process; and

FIG. 3 illustrates integration of a consumer electronics product made possible through use of the subject process.

DESCRIPTION OF THE PREFERRED EMBODIMENTS

Figure 1:
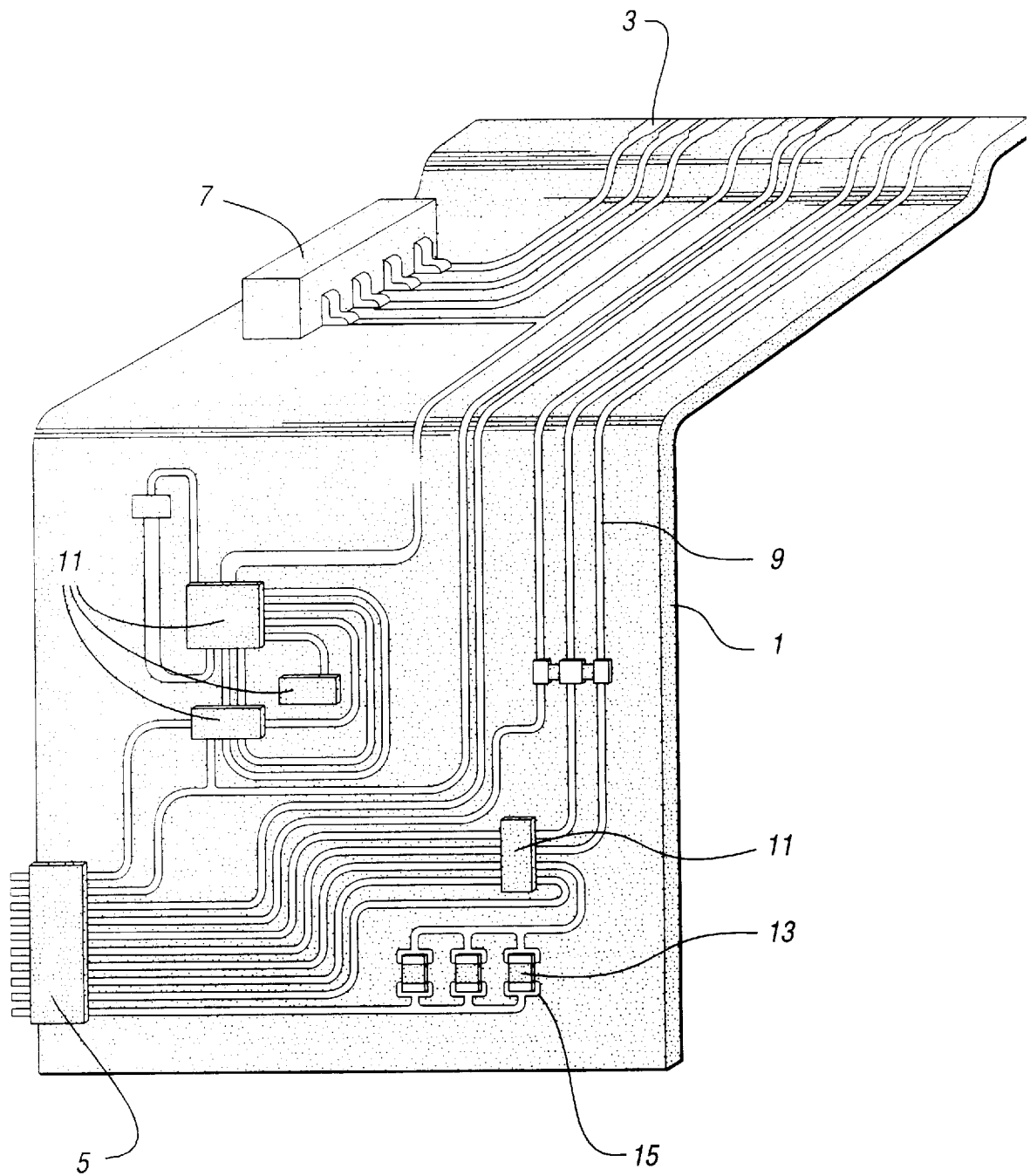
FIG. 1 illustrates the use of the subject process for integration of an automotive component.

The subject process requires providing a substrate of low heat distortion temperature thermoplastic having applied thereon the desired solder on the pad of the interconnecting traces. The entire substrate may be of low HDT thermoplastics or only a portion thereof. Suitable low HDT thermoplastics generally have heat distortion temperatures below 350° F. (177° C.) with most being in the range of 190° F. (88° C.) to 250° F. (121° C.) and are commercially available. These include by example, but not by way of limitation, polyethylene, polypropylene, polybutylene, other polyalkylene polymers and copolymers, polyvinylchloride, thermoplastic polyurethane, ABS (acrylonitrile/butadiene/ styrene copolymer), SAN (styrene/acrylonitrile copolymer) polystyrene, and the like. The solder on the pad may be provided by numerous techniques, e.g. electroplating, electroless plating, metal spraying, lithographic techniques, printing/dispensing solder paste followed by reflow, metal foil lamination, etc. The various techniques are well known to those skilled in the art. Specifically, solder may be delivered using solder preforms.

Low melting solders may be chosen from among numerous commercially available solder alloys known to those skilled in the art. The various physical properties of such alloys, e.g. their fatigue resistance, corrosion resistance, tensile strength, etc., are well known, as are their melting points. Melting points advantageously range from about 100° C. to about 170° C., although solders of both higher and lower melting points may be used as required. However, if the melting point of the solder is too high, the electronic component to be soldered may not be of sufficient mass and/or be capable of being heated to a temperature sufficient to supply enough heat to melt the solder. Integrated circuits, for example, should in general not be heated substantially above 220° C., although components such as ceramic resistors, ceramic capacitors, and the like, are frequently able to withstand higher temperatures.

Examples of a variety of suitable solders is presented in Table 1 below. Many others are, of course available. Solders containing cadmium are not listed, as cadmium is toxic and current thought is that its use should be limited. However, such solders are also usable with the subject invention, and are candidates especially for limited numbers of interconnects where strength or other factors outweigh use of a limited amount of cadmium-containing solders.

TABLE 1

Solder Composition, weight percent m.p. (°C.)
Low Temperature Solders

| Composition (wt %) | M.P. (°C.) |
|---|---|
| 58Bi/28Pb/22Sn | 100 |
| 46Bi/34Sn/20Pb | 100 |
| 54.5Bi/39.5Pb/6Sn | 102–108 |
| 67Bi/33In | 109 |
| 52.98Bi/42.49Pb/4.53Sn | 103–117 |
| 52In/48Sn | 120 |
| 50In/50Sn | 118–125 |
| 40In/40Sn/20Pb | 121–130 |
| 57.42Bi/41.58Sn/1Pb | 135 |
| 58Bi/42Sn | 138 |
| 97In/3Ag | 143 |
| 58Sn/42In | 118–145 |
| 99.3In/0.7Ga | 150 |
| 48Sn/36Pb/16Bi | 140–162 |
| 100In | 157 |
| 60Sn/40Bi | 138–170 |

In general, it is preferable to apply a solder of limited thickness on the conductor pad on the substrate, following which a solder preform supplies the majority of the solder used to form the soldered connection. The solder preform alloys, some examples of which are shown in Table 1, need not be the same as those on the pads. Moreover, either or both of the solder preforms or solder on the pads may be coated with a flux, preferably a rosin-type or adipic acid-type flux, to ensure a metallurgically sound joint. Solder preforms, as is well known, are generally stamped or cut from a thin foil in a shape and thickness appropriate for the particular joint to be formed. Photochemical machining may also be used to manufacture solder preforms. In general, the preform thickness may range from about 100 μm to 300 μm, although both thicker and thinner preforms may also be used. Preforms are adhered to the pads by traditional techniques.

The components to be soldered encompass a wide variety of electrical devices, including simple wire or multiple-wire ribbon-type interconnects; resistors, capacitors, transistors, diodes, integrated circuits, LEDs, incandescent light sockets, relays, flashers, induction coils, and the like. There is no particular limitation on the nature and/or size of the particular electrical component, except that the component must be capable of withstanding a temperature which is higher than the melting temperature of the solder and high enough such that a sufficient quantity of heat may be transferred to the solder to enable melting and flow/reflow to form a metallurgically sound and electrically conductive bond. In this respect, components which are large may require heating to a lower temperature than small components. However, in general, most components will be of at least reasonably similar size, and will usually be heated to the same temperature.

The substrate is preferably heated to a temperature which is about 5° C. to 30° C., preferably about 10° C. to 20° C. below the melting point of the solder and which is less than the heat distortion temperature of the thermoplastic. These two requirements will facilitate selection of a particular solder. For example, if the heat distortion temperature of a particular thermoplastic is 130° C. and a solder melts at 170° C., then this combination is not likely to provide acceptable results, unless the electrical components can withstand higher temperatures such that the required temperature differential between the allowable substrate temperature (c.a. 120° C. in this case) and solder melting point (170° C.) can be overcome. In the case of 130° C. HDT thermoplastic, it would be preferable to employ a low melting solder, e.g. one with a melting point of 120° C. or less. The selection of a particular solder is a common sense decision well within the knowledge of one skilled in the art.

The electrical component temperature is similarly easily determined by one skilled in the art. The temperature must be below temperatures which would cause component damage. Discrete devices such as ceramic resistors and capacitors, etc., can usually withstand temperatures in excess of 250° C. Other packaged components such as relays, coils, etc., however, are usually more limited in their ability to withstand temperature excursions. Most such devices can withstand temperatures of c.a. 200–220° C., which is generally sufficient for operation in the subject process. The maximum temperature which may be safely utilized can usually be obtained from the device manufacturer, or may be easily determined from device failure rates obtained from devices subject to a given processing protocol.

While it may be important to know the maximum temperature which a given device can withstand, it is also generally important to choose a temperature such that heat in excess of the minimum amount required to melt and reflow the joint is present, but the excess amount is such that the joint rapidly solidifies due to heat being transferred away from the joint through the substrate or surrounding air/atmosphere, or is at most such that minimal time is required in a cooler environment to allow the joint to solidify. While the exact amount may be determined by simple experiments, it is also possible to calculate the temperature based on amount of heat required by the joint, i.e. its geometry, the heat of fusion of the solder, the solder pad/preform surface and edge areas, the thermal conductivity of the substrate, the mass and heat capacity of the component and component leads, etc. Preferably, the components are heated to temperatures in the range of 180° to 350° C., more preferably 190° C. to 250° C., and most preferably about 200° C. to 220° C. The component should not be heated to a temperature such that excess heat damages the substrate.

In many instances, a flux is desired for removing oxides and thereby obtaining a sound metallurgical joint. Fluxes may be incorporated on or in the solder pads, solder preforms, or pre-tinned leads, or may be separately supplied as a spray, coating, foam, and/or by dipping, liquid immersion, dispensing, etc. Lithographic techniques may be used as well. Plasma or other methods may also be used for oxide removal. Following soldering, residual flux may be left on the substrate or may be removed by conventional techniques such as solvent washing, etc. Following such techniques, the now-soldered substrate and component assembly may be encapsulated with a protective coating to protect the solder joints from oxidation and other adverse effects. Where necessary, additional means of providing thermal energy to facilitate soldering one or more joints may also be used, either on all the joints on the substrate or only on selected joints. Such additional energy may be in the form of laser energy, electron beam, focused infrared, microwave, ultrasonic, etc, and/or carried through heated tools that are used to place the electronic components on the circuit.

FIG. 1 illustrates the use of the subject invention to integrate electronic circuitry on a non-parasitic, low HDT structure. The structural member 1 of low HDT thermoplastic provides both structural support as well as a mounting surface for the electronic components. Hence, there is no "parasitic" load, or "redundancy" common when a circuit board is mounted to a structural member. Because the structural low HDT polymer member is not distorted by mounting of components in accordance with the subject invention, it may have a shape dictated by both function and aesthetics as well as serving as the mounting surface for the electronic components.

At 3 in FIG. 1 are located edge card interconnections while at 5 and 7 are shown male and female pin-type connector devices. Conductive traces 9 connect active devices 11, passive devices 13, and the respective connectors 3, 5, and 7. The traces are preferably located directly on the surface of the low HDT plastic. Shown at 15 are solder pads to which the devices have been soldered by heating the structural member, traces, and solder pads to a temperature somewhat lower than the solder melting point and applying to the solder pads the various connectors, devices, etc., heated to a temperature higher than the solder temperature.

FIG. 2a illustrates one embodiment of the process of the subject invention. A substrate of low HDT (150° C.) thermoplastic 21 has applied thereon circuit conductor pads 23, onto which is applied solder (such as solder preforms 25) having a melting point of 125° C. The substrate, solder pads, and solder preforms are heated to about 115–120° C., for example on a conveyor belt in a low temperature oven. Electronic components, in this case chip resistor 27, and semiconductor diode 29 are secured by reusable clamps 26 secured to metal or polymeric (such as high HDT thermoplastic) carrier 28. The carrier, components, and clamps are heated to about 200° C. to 220° C., the carrier and substrate approach each other, contacting electrical component leads or end termination 24 with their respective solder pads/preforms. Contact is maintained until a metallurgically sound solder joint is formed by solder flow followed by solidification, and carrier removed, resulting in FIG. 2b, a completed electronic circuit on an undistorted, low HDT thermoplastic substrate.

In FIG. 3 is shown an example of the type of electronics/plastics integration which may be achieved with the subject invention for a consumer electronics product. A polystyrene computer monitor case 31 is shown without the CRT and without power transformer and video transformer. In conventional computer monitors, the interior circuitry is created on separate printed circuit boards. Power transistors and diodes on such circuit boards are frequently mounted to metal heat radiators (sinks). The circuit boards are then mounted to the case by employing a separate metal frame or by bolting the individual circuit boards to molded-in standoffs, the boards being connected by multiple conductor ribbons and in-line connectors.

In FIG. 3, circuitry equivalent to two separate circuit boards is mounted directly to the polystyrene case itself, without any separate circuit boards, standoffs, or connecting hardware. In addition, the connections between the two circuit boards requires no wires or multiple conductor ribbon connectors. Within the area on the case inside bottom bounded by dotted lines 33 are soldered, to respective solder pads/preforms (not labeled for clarity) and copper connecting traces 34, integrated circuits 35. Within the area on the case inside side wall 39 is found the equivalent of a second circuit board, having its integrated circuit components 35 and discrete components 37 soldered to solder pads located directly on the low HDT case itself. Rather than use wires or a multiple-conductor ribbon connector to make the electrical connections between the circuit components in areas 33 and 39, the copper conductor traces 41 are plated/printed/laminated directly around the interior walls of the case. By contrast to conventional assemblies, in many designs, component heat may be dissipated directly through the case, eliminating the need for separate and relatively expensive heat sinks. The case may be constructed of heat conductive filled low HDT thermoplastic for greater heat transfer, e.g., polystyrene incorporating metallized metal particles or metal flakes.

Thus, the subject invention pertains to a method for soldering and interconnecting electronic components on a low heat distortion substrate, this method comprising selecting a substrate of low heat distortion temperature thermoplastic; providing solder pads as part of the electrical conductor traces on at least one surface of the substrate; and providing solder such as solder preforms onto one or more of the solder pads, the solder having a relatively low melting temperature. One or more electronic components having electronic component leads or end termination to be soldered to respective solder pads are then provided; the substrate heated to a first temperature lower than the solder melting temperature and lower than the heat distortion temperature of the thermoplastic, and the electronic component(s) heated to a second temperature higher than the melting temperature of the solder. The electronic component leads/end termination are then contacted with the respective solder pads for a time sufficient to melt the solder and form a solder joint between the solder pads and the electrical component leads or end termination, the first and second temperatures such that sufficient heat transfers from the electronic components to the solder to cause the solder to melt and flow to form a plurality of the solder joints.

The subject invention further pertains to an integrated electronic component-containing construction comprising a substrate of low heat distortion temperature thermoplastic, said construction having structural, functional, and/or aesthetic surfaces, at least one of the said functional surfaces having mounted directly thereto a plurality of solder pads as part of the electrical conductor traces, said pads having applied thereto solder such as solder preforms, and having soldered to the solder pads a plurality of electronic component leads/end termination, wherein a low melting solder adheres to the solder pad and the leads/end terminations forming a solder joint therebetween.

By the term "non-integrated circuit board" as used herein is meant a separate circuit board which must be mounted onto a substrate by conventional fastening means and is not comprised of a low HDT thermoplastic having components soldered directly to solder supplied thereon. By "mounted directly thereto" is meant that the solder pads, and ultimately the electronic components, are mounted directly on the low HDT thermoplastic without the intervention of any high HDT thermoplastic of sufficient thickness so as to preclude damage to the low HDT thermoplastic. Preferably, the solder pads, electrical conductor traces, etc., are plated directly onto the substrate, or adhesively bonded thereto by a thin layer of thermoplastic or thermoset adhesive. The term "mounted directly thereto" excludes sandwich type structures which are prepared in sandwich form and have an appreciably thick high HDT thermoplastic exterior as shown in U.S. Pat. No. 4,774,126, but does not exclude the addition of a thin, essentially non-functional layer of high HDT thermoplastic, i.e., Mylar™, Kapton™, or Ultem™. By "non-functional" is meant that the construction could be prepared without distortion by the process of the invention without the use of the particular film, i.e. the film serves no purpose in protecting the substrate from heat induced damage/distortion.

Having now fully described the invention, it will be apparent to one of ordinary skill in the art that many changes and modifications can be made thereto without departing from the spirit or scope of the invention as set forth herein.

What is claimed is:

1. A method for soldering electronic components to a low heat distortion substrate, said method comprising:
    a) selecting a substrate comprising a low heat distortion temperature thermoplastic;
    b) providing solder on the pads of the electrical conductor traces on at least one surface of said substrate; said solder having a low melting temperature;
    c) providing one or more electronic components having electronic component leads or end terminations to be soldered to respective solder pads;
    d) heating said substrate to a first temperature lower than said solder melting temperature and lower than the heat distortion temperature of said thermoplastic;
    e) heating said electronic component(s) to a second temperature higher than the melting temperature of said solder;
    f) contacting said electronic component leads or end terminations with said respective solder for a time sufficient to melt said solder and form a solder joint between said solder and said electrical component leads or end terminations, wherein said first temperature and said second temperature are such that sufficient heat transfers from said electronic components to said solder to cause said solder to melt and flow to form said solder joints.

2. The process of claim 1 wherein said solder is provided on said pads by means of solder preforms.

3. The process of claim 1 wherein said solder has a melting point in the range of 120° C. to about 170° C.

4. The process of claim 1 wherein said low heat distortion thermoplastic is selected from the group consisting of polyethylene, polypropylene, polybutylene, polyalkylene copolymers, polystyrene, ABS, SAN, polyvinylchloride, thermoplastic polyurethane, and mixtures thereof.

5. The process of claim 1 wherein said electronic component(s) are positioned mounted on a carrier, said carrier and said electronic component(s) mounted thereon heated to said second temperature.

6. The process of claim 1 wherein one or more of said solder joints are created by assisting solder melt and flow by the aid of an additional, localized source of energy.

7. The process of claim 6 wherein said additional, localized source of energy comprises laser energy, infrared energy, microwave energy, electron beam energy, ultrasonic energy, and/or heat carried by heated tools that are used to place electronic components on the circuit or combinations thereof.

8. The process of claim 1 wherein said first temperature is about 100° C., said solder melts at about 120° C., and at least a portion of said electronic components are heated to about 200° C.

9. The process of claim 1 wherein said first temperature is from about 10° C. to about 30° C. lower than said heat distortion temperature and said second temperature is in the range of from about 200° C. to about 220° C.

10. The process of claim 8 wherein said thermoplastic comprises polypropylene, polystyrene, ABS, or SAN.

11. The process of claim 1 wherein said substrate comprises an electronic device case, said solder pads, electrical conductor traces, and said electronic components mounted directly on an interior surface of said case.

12. The process of claim 2 wherein said substrate comprises a vehicle instrument panel, said solder pads, electrical conductors, and electronic components directly contacting a non-observable surface of said instrument panel.

* * * * *